(12) United States Patent
Sarraj

(10) Patent No.: US 6,724,236 B1
(45) Date of Patent: Apr. 20, 2004

(54) BUFFERED BOOTSTRAPPED INPUT SWITCH WITH CANCELLED CHARGE SHARING FOR USE IN HIGH PERFORMANCE SAMPLE AND HOLD SWITCHED CAPACITOR CIRCUITS

(75) Inventor: Maher M. Sarraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/269,814

(22) Filed: Oct. 12, 2002

(51) Int. Cl.[7] .............................................. H03K 17/16
(52) U.S. Cl. ...................................... 327/390; 327/589
(58) Field of Search ................................. 327/390, 536, 327/537, 589

(56) References Cited

U.S. PATENT DOCUMENTS

| | | | |
|---|---|---|---|
| 5,170,075 A | 12/1992 | De Wit | 307/353 |
| 5,828,262 A | * 10/1998 | Rees | 327/390 |
| 6,323,697 B1 | 11/2001 | Pavan | 327/94 |
| 6,489,758 B2 | * 12/2002 | Moriconi et al. | 323/288 |

OTHER PUBLICATIONS

Dan Kelly, Will Yang, Luri Mehr, Mark Sayuk, Larry Singer, 2001 IEEE International Solid–State circuits Conference, "A 3V 340mW 14b 75MSPS CMOS ADC with 85dB SFDR at Nyquist", pp 134–135, Feb. 6, 2001.

* cited by examiner

Primary Examiner—Timothy P. Callahan
Assistant Examiner—An T. Luu
(74) Attorney, Agent, or Firm—J. Dennis Moore; W. James Brady, III; Frederick J. Telecky, Jr.

(57) ABSTRACT

A buffered bootstrapped input switch employs cancelled charge sharing for use in high performance sample and hold switched capacitor circuits especially useful for implementing, for example, an analog-to-digital converter (ADC) or amplifier circuit front end sampling network, among others. A scheme is employed for estimating the charge loss from the bootstrapping capacitor to the gate of the bootstrapped input switch, storing the estimated charge loss on a small capacitor, buffering the small capacitor, and then adding the estimated charge loss in series to the bootstrap capacitor, to provide an almost ideal bootstrap network.

7 Claims, 5 Drawing Sheets

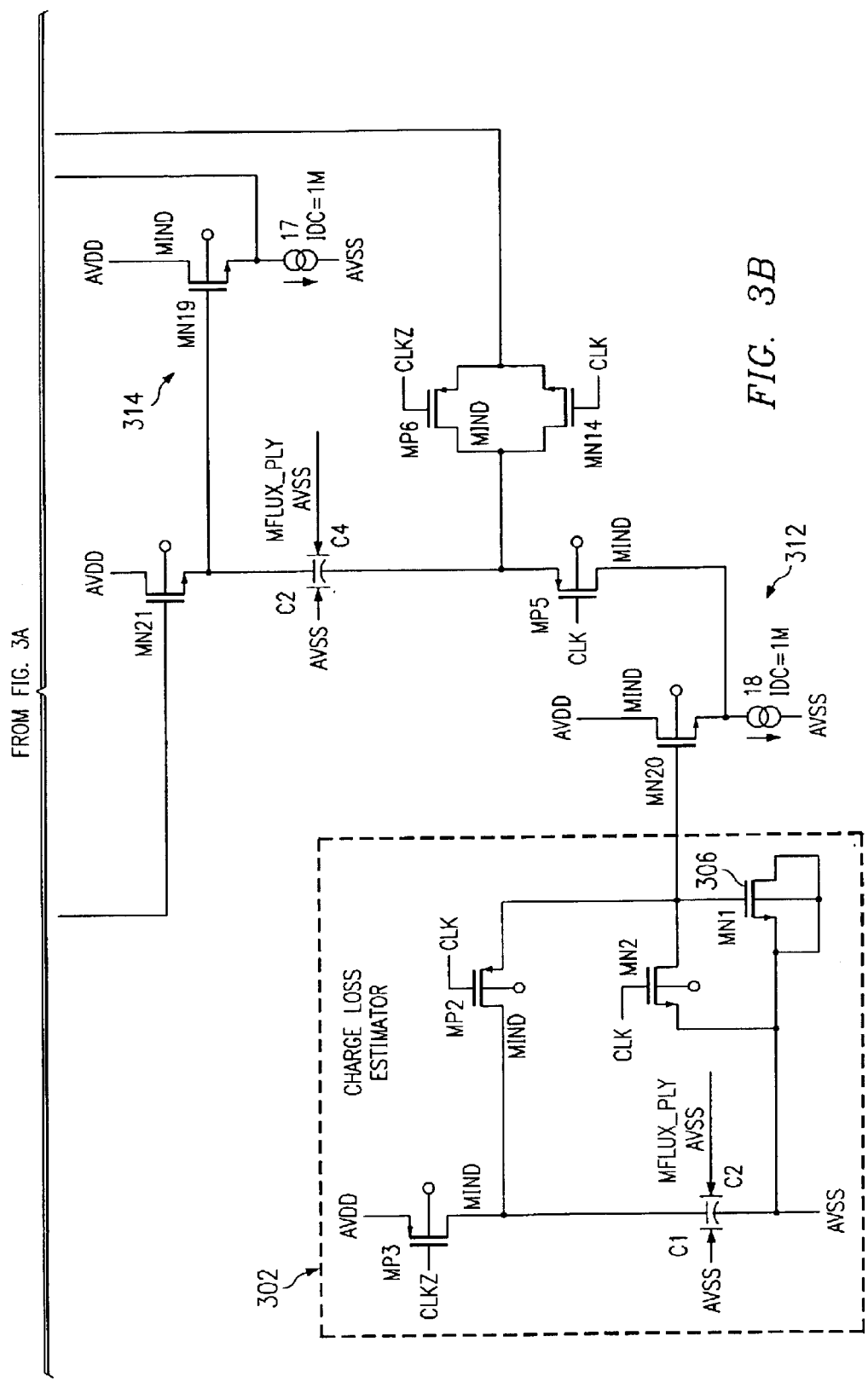

BUFFERED BOOTSTRAPPED INPUT SWITCH WITH CANCELLED CHARGE SHARING FOR USE IN HIGH PERFORMANCE SAMPLE AND HOLD SWITCHED CAPACITOR CIRCUITS

BACKGROUND OF THE INVENTION

1. Field of the Invention

This invention relates generally to transistor switches, and more particularly to a buffered bootstrapped input switch that employs cancelled charge sharing for use in high performance sample and hold switched capacitor circuits especially usefull for implementing an analog-to-digital converter (ADC) or amplifier circuit front end sampling network.

2. Description of the Prior Art

The core dynamic performance of a switched capacitor ADC or amplifier circuit is determined by the front-end sampling network (Sample and Hold) such as that illustrated in FIG. 1. This network 100 comprises a pair of bootstrapped NMOS switches 102, 104 sampling the analog inputs applied to associated capacitors 106, 108 at the same rate as the clock 106.

The quality of the sampling switches 102, 104 can affect the linearity of the sampled value. For this reason, bootstrapping techniques such as that shown in FIG. 2 are used to maintain a constant voltage between the gate and the source of the switches 102, 104.

The bootstrap circuit 200 is problematic in two ways. First, there is substantial loading on the input by the bootstrapping capacitor 202. Buffering the input has been found to solve this problem. Second, there is charge sharing between the bootstrapping capacitor 202 and the gate capacitance of the input switches 102, 104. This charge sharing effect occurs when the charged bootstrapping capacitor 202 connects in series to the gate of either sampling switch 102, 104 (Charge is lost to charge the gate), resulting in a reduced bootstrapped voltage. Very large bootstrapping capacitors (greater than 10–20 pF) have classically been employed to alleviate this second problem, which undesirably limits the speed of the charging circuit, and increases power dissipation.

It is therefore both advantageous and desirable in view of the foregoing, to provide a buffered bootstrapped input switch that employs cancelled charge sharing for use in high performance sample and hold switched capacitor circuits especially useful for implementing, for example, an analog-to-digital converter (ADC) or amplifier circuit front end sampling network, among others.

SUMMARY OF THE INVENTION

The present invention is directed to a buffered bootstrapped input switch that employs cancelled charge sharing for use in high performance sample and hold switched capacitor circuits especially useful for implementing, for example, an analog-to-digital converter (ADC) or amplifier circuit front end sampling network, among others. A scheme is employed for estimating the charge loss from the bootstrapping capacitor to the gate of the bootstrapped input switch, storing the estimated charge loss on a small capacitor, buffering the small capacitor, and then adding the estimated charge loss in series to the bootstrap capacitor, to provide an almost ideal bootstrap network.

According to one embodiment, a switching network comprises at least one MOS switch having a gate and a source; a bootstrapping capacitor configured to maintain a substantially constant voltage between the gate and the source of the at least one MOS switch; and a dummy input network configured to eliminate charge sharing between the bootstrapping capacitor and the gate capacitance of the at least one bootstrapped MOS switch.

According to another embodiment, a switching network comprises at least one bootstrapped input switch; and a dummy input network configured to cancel charge sharing associated with the at least one bootstrapped input switch.

According to yet another embodiment, a method of canceling charge sharing comprises the steps of providing a switching network comprising at least one bootstrapped input switch and a dummy input network configured to constantly measure charge loss associated with the at least one bootstrapped input switch; and canceling charge sharing between the at least one bootstrapped input switch and a bootstrapping capacitor in response to the measured charge loss.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawing figures wherein:

FIGS. 3A and 3B show a schematic diagram illustrating a bootstrapping network according to one embodiment of the present invention;

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 3A:
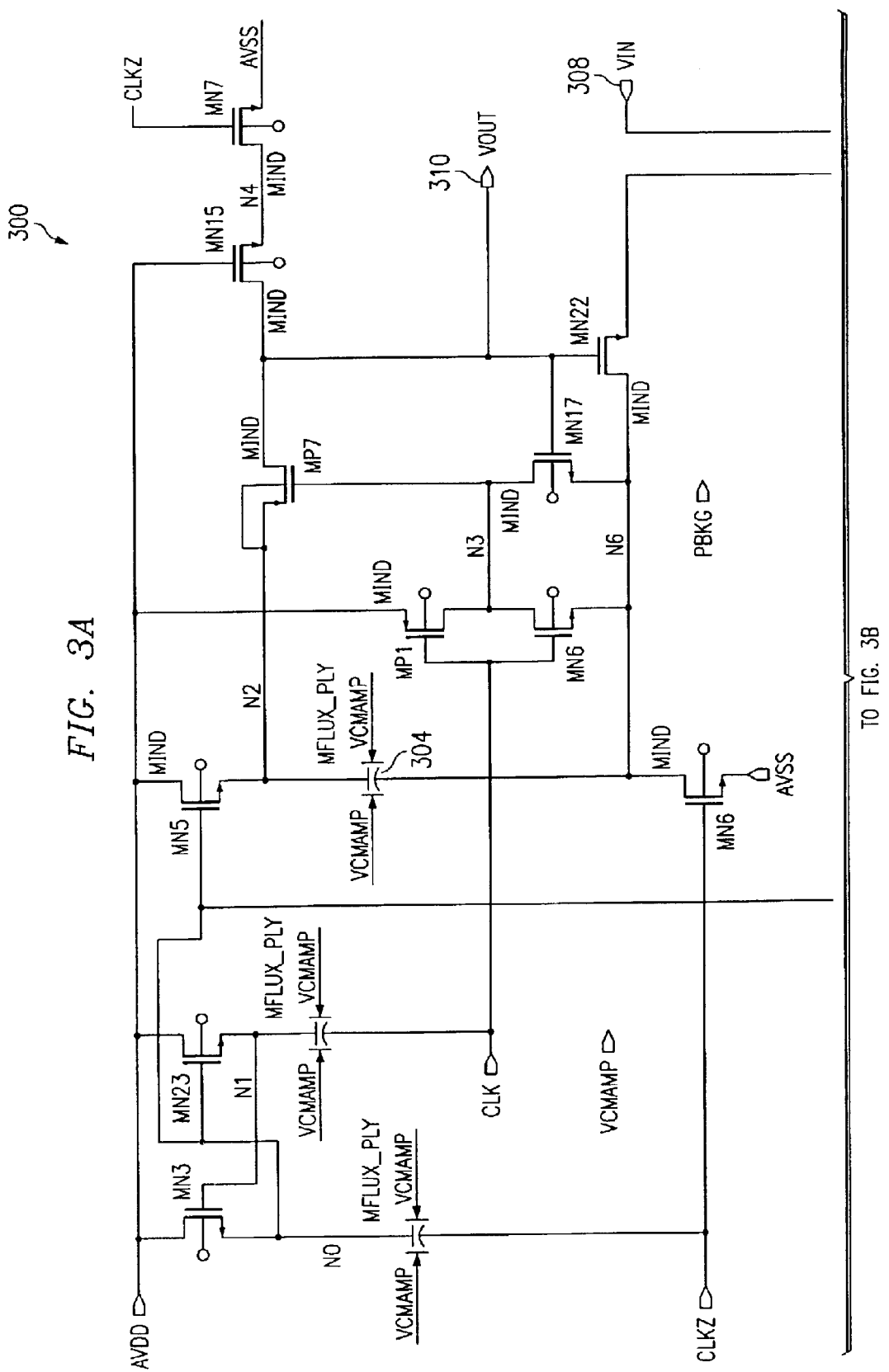

FIGS. 3A and 3B show a schematic diagram illustrating a bootstrapping network 300 according to one embodiment of the present invention. Bootstrapping network 300, as stated herein before, employs a scheme for estimating the charge loss from the bootstrapping capacitor 304 to the gate of the respective bootstrapped input switch (i.e. 102, 104 in FIG. 1), storing the estimated charge loss on a small capacitor C2, buffering the small capacitor C2, and then adding the estimated charge loss in series to the bootstrap capacitor 304, to provide an almost ideal bootstrap network 300. This results in a final gate-source voltage Vgs across the input switch 102, 104 that is equivalent to the full supply voltage Vdd.

It can be appreciated that the bootstrapping network 300 will allow the use of a smaller bootstrap capacitor, and therefore a higher clocking speed and lower power consumption. The present inventor also found bootstrapping network 300 to be process and temperature independent since it constantly measures the charge loss.

Figure 1:
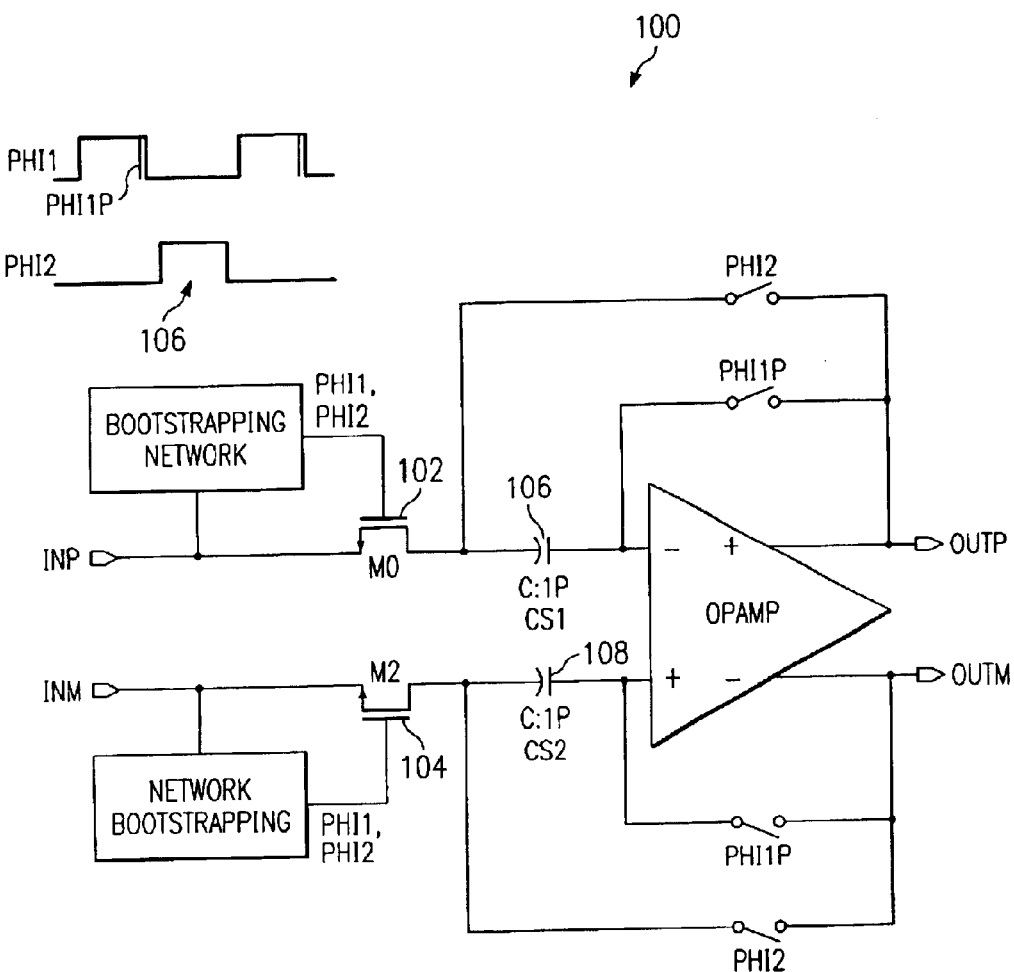
FIG. 1 is a schematic diagram illustrating a sample and hold circuit that is known in the art.

Looking again at FIG. 3, the first section of the bootstrapping network 300 is the charge loss estimator 302. The charge loss estimator circuit 302 replicates the input section of sample and hold (S/H) circuit (bootstrapping network 300). The VIN pin 308 connects directly to the input of the S/H, while the VOUT pin 310 connects to the gate of its associated input switch (i.e. 102 or 104 in FIG. 1). All the elements in FIGS. 3A and 3B are considered as part of the S/H input section. The input switches 102, 104 and capacitors 106, 108 shown in FIG. 1 are also part of the S/H input section.

During the sampling phase (CLK high), a capacitor C1 having the same value as the bootstrap capacitor 304 is charged to supply voltage Vdd; and a dummy NMOS 306 having the same aspect ratio as its associated input sampling switch 102, 104, is discharged to ground. Dummy NMOS 306 can be seen to have its source and drain shorted to AVSS.

During the hold phase (CLK low), the capacitor C1 is shorted to the dummy NMOS 306; and the resulting voltage is buffered and stored on a second capacitor C2. The value of the stored voltage on capacitor C2 is exactly the amount of charge loss plus the follower 312 gate-source voltage Vgs.

During the sampling phase (CLK high), the capacitor C2 gets connected in series with the input 308. A second follower 314, comprising transistor MN19 and current source 17, is necessary to both buffer the input 308 from the bootstrapping capacitor 304, and to remove the unwanted voltage Vgs generated by the follower 312, comprising transistor MN20 and current source 18. Since the two followers 312, 314 can be designed to have substantially identical characteristics, the gate-source voltages Vgs track with process and temperature to cancel one another. The resulting series addition of capacitor C2 and bootstrap capacitor 304 yield Vdd; and therefore compensate for any charge loss. The technique will then allow the use of a small bootstrapping capacitor 304, and will also allow for higher switching speeds while consuming less power, as stated herein before.

In summary explanation, a circuit and method are provided to implement an input sampling switch for a high performance Nyquist S/H switch capacitor circuit, among others, that allows use of a smaller bootstrapping capacitor and that is devoid of charge sharing.

Figure 2:
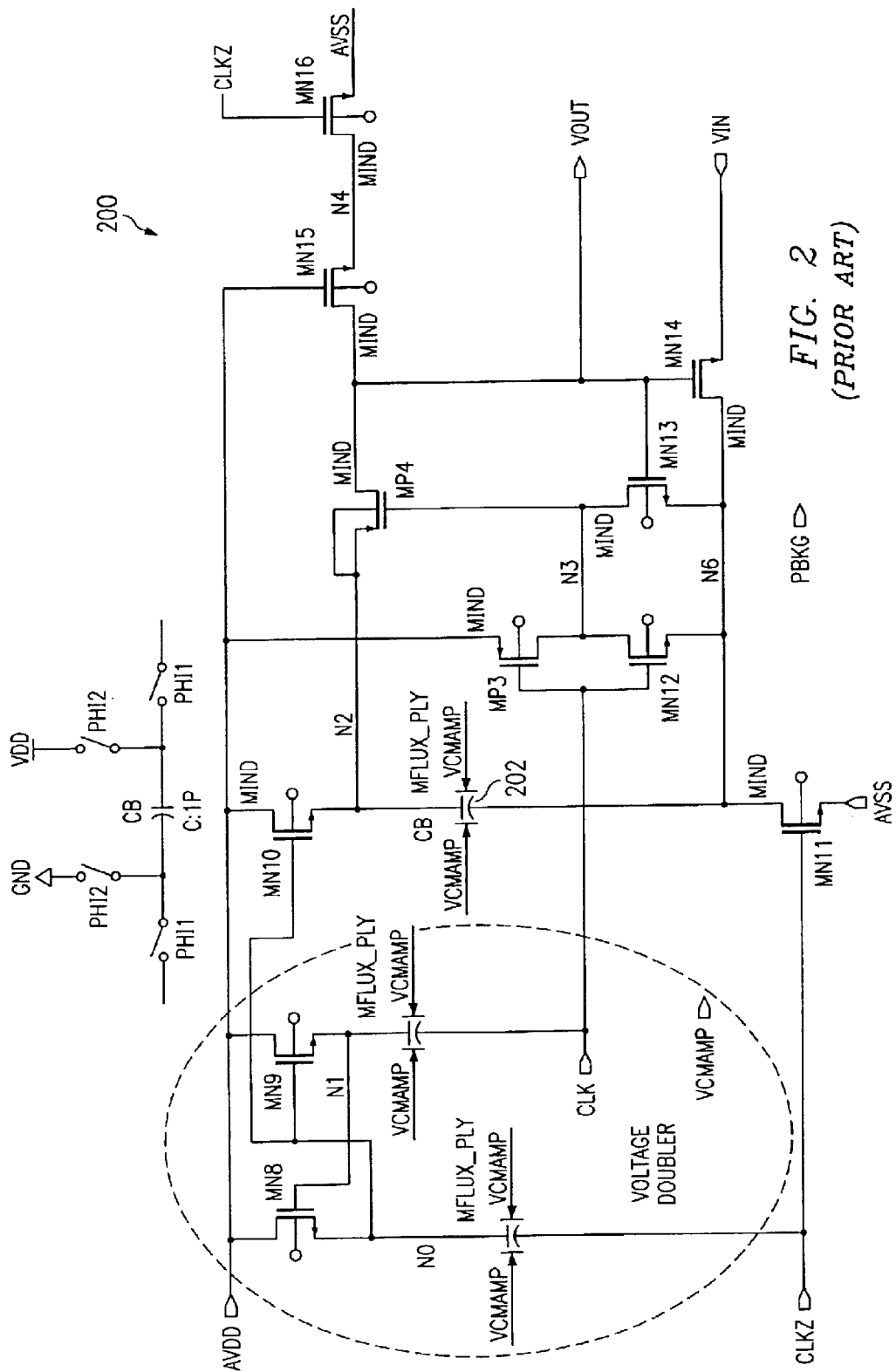
FIG. 2 is a schematic diagram illustrating a bootstrapping circuit that is known in the art.
Figure 4:
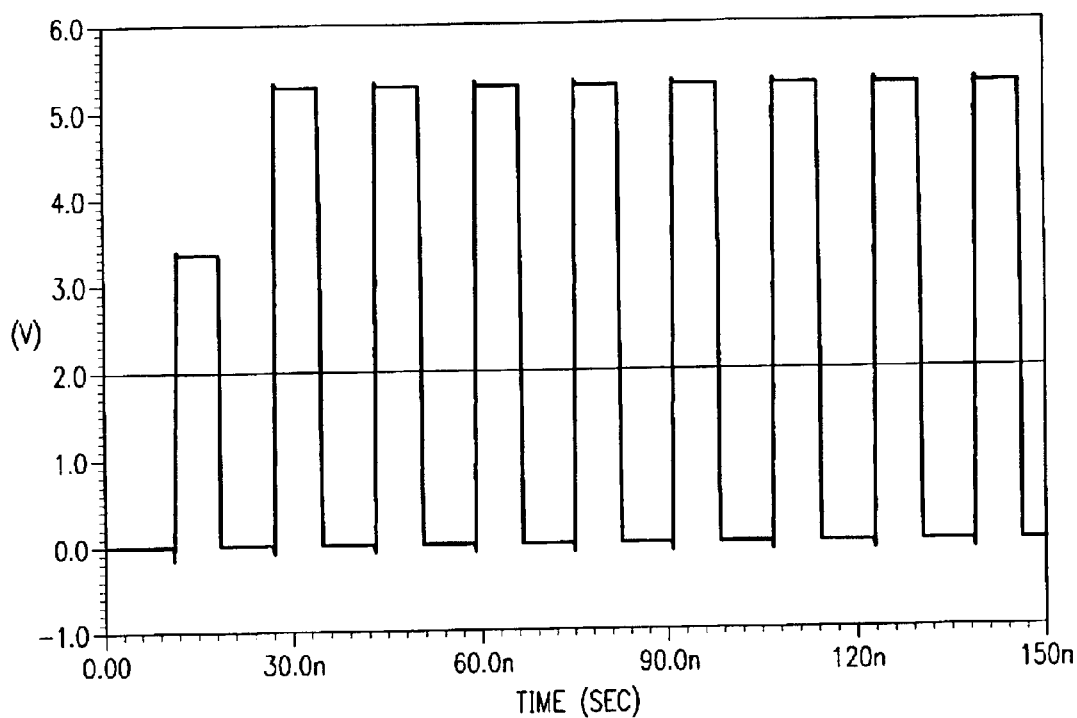
FIG. 4 is a graph illustrating switching times associated with the bootstrapping circuit shown in FIG. 3.
Figure 5:
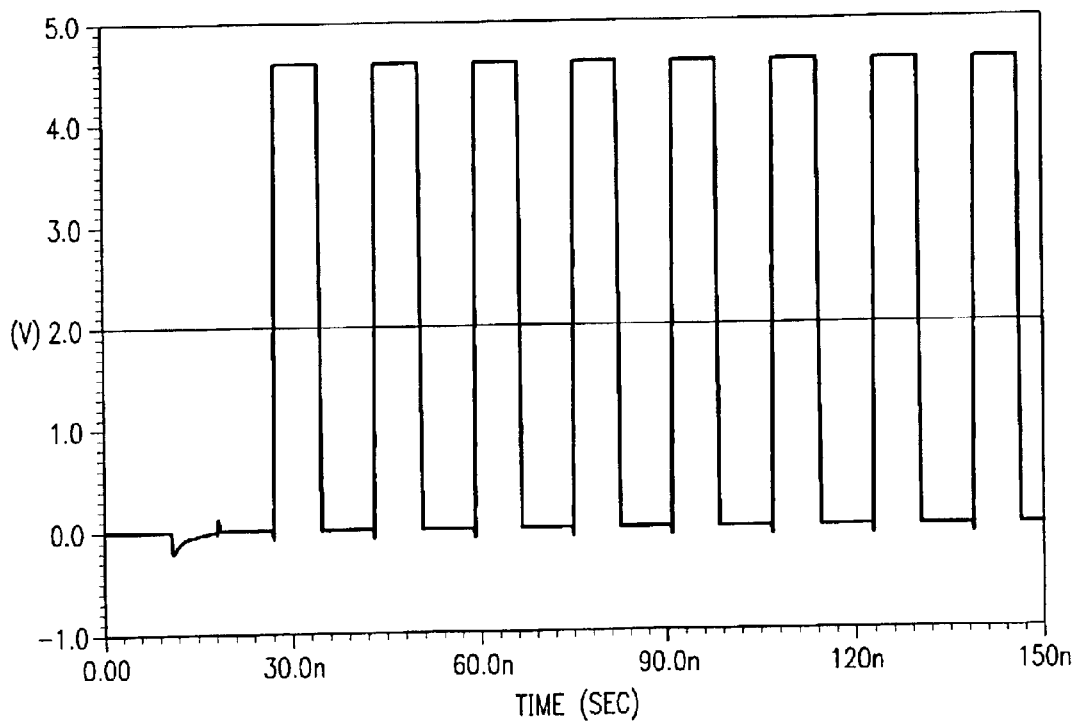
FIG. 5 is a graph illustrating switching time associated with the bootstrapping circuit shown in FIG. 2.

FIG. 4 is a graph illustrating switching times associated with the bootstrapping circuit 300 shown in FIGS. 3A and 3B; and FIG. 5 is a graph illustrating switching times associated with the prior art bootstrapping circuit 200 shown in FIG. 2.

In view of the above, it can be seen the present invention presents a significant advancement in the art of high performance sample and hold switched capacitor circuits. Further, this invention has been described in considerable detail in order to provide those skilled in the bootstrapped input switch art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A switching network comprising:

at least one MOS switch having a gate and a source;

a bootstrapping capacitor configured to maintain a substantially constant voltage between the gate and the source of the at least one MOS switch; and a dummy input network configured to eliminate charge sharing between the bootstrapping capacitor and the gate capacitance of the at least one bootstrapped MOS switch, said dummy input network including a second capacitor, said dummy input network estimating the charge loss from the bootstrapping capacitor to the gate of the MOS switch, storing the estimated charge loss on a second capacitor, and adding the stored charge loss to the charge loss from the bootstrapping capacitor such that the voltage across the gate and source of the MOS switch is a full supply voltage.

2. The switching network according to claim 1 wherein the at least one MOS switch comprises an NMOS transistor.

3. The switching network according to claim 1 wherein said dummy input network includes a charge loss estimator circuit coupled to said second capacitor, said charge loss estimator having a third capacitor of the same value as the bootstrap capacitor and a dummy MOS switch with the same aspect ratio as said MOS switch, said charge loss estimator circuit responsive to a clock signal having a first state to charge said third capacitor to the supply voltage and discharge said dummy MOS switch to ground, said charge loss estimator circuit responsive to a clock signal having a second state to short the third capacitor to the MOS switch.

4. The switching network according to claim 3 wherein dummy input network further includes a first MOS follower transistor, said charge loss estimator circuit is coupled to the gate of said first MOS follower transistor, a drain of said first MOS follower transistor is coupled to the supply voltage, and a source of said first MOS follower transistor is coupled to ground and to a first terminal of said second capacitor, said charge loss estimator circuit responsive to said clock signal having said second state to store a voltage on said second capacitor equal to the estimated charge loss from the bootstrapping capacitor plus the gate-source voltage of said first MOS follower transistor.

5. The switching network according to claim 3 wherein dummy input network further includes a second MOS follower transistor having a gate coupled to a second terminal of said second capacitor, a drain coupled to the supply voltage, and a source coupled to ground, said second MOS follower transistor substantially identical to said first MOS follower transistor.

6. A method of canceling charge sharing comprising the steps of:

providing a switching network comprising at least one bootstrapped input switch and a dummy input network configured to constantly measure charge loss associated with the at least one bootstrapped input switch; and canceling charge sharing between the at least one bootstrapped input switch and a bootstrapping capacitor in response to the measured charge loss;

wherein the step of canceling charge sharing between the at least one bootstrapped input switch and a bootstrapping capacitor in response to the measured charge loss comprises the steps of:

estimating the charge loss from the bootstrapping capacitor to the gate of the MOS switch;

storing the estimated charge loss on a second capacitor, and adding the stored charge loss to the charge loss from the bootstrapping capacitor such that the voltage across the gate and source of the MOS switch is at least a full supply voltage.

7. The method according to claim 6 wherein the at least one bootstrapped input switch comprises a MOS switch having a gate and a source.

* * * * *